United States Patent [19]

Rebaudo et al.

[11] Patent Number: 4,470,100
[45] Date of Patent: Sep. 4, 1984

[54] PRINTED CIRCUIT BOARD CONNECTOR FOR USE IN COMPUTER SYSTEMS

[75] Inventors: Amadeus P. Rebaudo, Belmont; Art J. Gwerder, Fremont; William C. Chow, San Jose; Stimson F. Ho, Cupertino, all of Calif.

[73] Assignee: Storage Technology Partners, Santa Clara, Calif.

[21] Appl. No.: 332,487

[22] Filed: Dec. 21, 1981

[51] Int. Cl.³ .............................................. H05K 1/14
[52] U.S. Cl. .................................. 361/413; 361/395; 361/415; 361/398; 339/17 M; 339/17 F; 339/75 M
[58] Field of Search .................. 361/392–395, 361/398, 399, 413, 415, 429, 412; 339/17 M, 17 F, 74 R, 75 M, 92 M, 174

[56] References Cited

U.S. PATENT DOCUMENTS

| | | | |
|---|---|---|---|
| 3,795,885 | 3/1974 | Desso | 339/17 F |
| 3,796,986 | 3/1974 | Tamburro | 339/92 M |
| 4,133,592 | 1/1979 | Cobaugh | 339/17 M |
| 4,250,536 | 2/1981 | Barringer | 361/413 |
| 4,401,351 | 8/1983 | Record | 361/415 |

Primary Examiner—G. P. Tolin
Attorney, Agent, or Firm—Spensley Horn Jubas & Lubitz

[57] ABSTRACT

A connector arrangement for making connections between printed circuit boards and connectors located on parallel side panels such as the side panels of a card cage of a computer central processing unit. The printed circuit boards are part of modules which include a retractable connector arrangement. The connectors are moved to a retracted position in which their width is less than the spacing between connectors on the side panels to facilitate their insertion between the side panels. Once in position, the modules are moved to an extended position and connections are made between the modules connectors and those on the side panels. The connectors provide low cost, high reliability, high density connections and facilitate close center-to-center spacings between adjacent modules.

15 Claims, 5 Drawing Figures

PRINTED CIRCUIT BOARD CONNECTOR FOR USE IN COMPUTER SYSTEMS

BACKGROUND OF THE INVENTION

1. Field of the Invention

This invention relates to high speed computers which utilize a central processing unit (CPU) having a large number of printed circuit boards or cards. Each card includes one or more integrated circuit chips as well as discrete wiring and components such as resistors and capacitors. In particular, the present invention relates to the provision of a connection assembly for coupling the printed circuit boards to a main frame within which they are supported.

In a high performance computer, there is always a need to package the electronics in the smallest space possible because shorter lengths of interconnection wire translate into faster speed, i.e., less time to perform a function. Packaging in smaller volumes creates higher interconnection densities on the printed circuit boards. Present interconnection methods are approaching forty contacts per inch on one edge of a printed circuit board. In order to effectively double the contact density, it is desirable to make connections to two opposite edges of the printed circuit board. The printed circuit board is carried in a frame, typically called a "card cage", having two stationary side panels. Connections are made by inserting the printed circuit boards into the card cage and connecting them to connectors carried on the side panels. Because the side panels are stationary, the connectors must be designed so that they do not require panel movement to facilitate connection.

2. Description of the Prior Art

The most common method of connecting opposite edges of a printed circuit board to connectors located on parallel side panels involves the use of "zero insertion force" connectors. Such connectors generally are in the form of a clip which extends over the top and bottom of the printed circuit board and is movable so as to clamp the printed circuit board. When the clip is opened, the printed circuit board can be slid into the proper position for connection. Such connectors are generally quite expensive and are not available in the long lengths which are required for the latest printed circuit boards. In addition, zero insertion force connectors have a relatively large vertical dimension, which prevents the use of a small center to center spacing between printed circuit boards. Furthermore, zero insertion force connectors do not have high enough density to enable them to be used with present high interconnection density printed circuit boards.

Aside from zero insertion force connectors, an expensive method has been developed in which individual connector blocks are connected to the side panels and are actuated with complex cam and sliding mechanisms. Such connectors are quite bulky and in addition create a great deal of stress which causes some deflection of the side panels.

SUMMARY OF THE INVENTION

The present invention provides a printed circuit board connector which eliminates the need for zero insertion force connectors while providing good accessibility and reliability and maintaining the cooling path for the devices on the printed circuit board. In general, the invention includes a printed circuit board module having a first connector set coupled to one edge of a printed circuit board and a second connector set coupled to an opposite edge of the board. The connector sets are movable with respect to each other to facilitate insertion into a card cage. In order to insert the printed circuit board module into a card cage, the connectors are moved to a retracted position in which the distance between them (i.e., the width of the module) is less than the distance between connectors on the side panels of the card cage. Once the module has been inserted into the card cage, the connector sets are moved to an extended position and coupled to the connectors in the card cage. In a preferred embodiment of the invention, the first set of connectors is rigidly secured to a printed circuit and the second set of connectors is slidably secured to the printed circuit board. The second set of connectors is coupled to the board by means of a flexible strip connector which accommodates movement of the connection from the retracted to extended positions.

BRIEF DESCRIPTION OF THE DRAWINGS

The invention will be described with reference to the accompanying drawings, wherein.

DESCRIPTION OF THE PREFERRED EMBODIMENT

The following description is of the best presently contemplated mode of carrying out the invention. This description is made for the purpose of illustrating the general principles of the invention and should not be taken in a limiting sense, since the scope of the invention is best determined by the appended claims.

Figure 1:
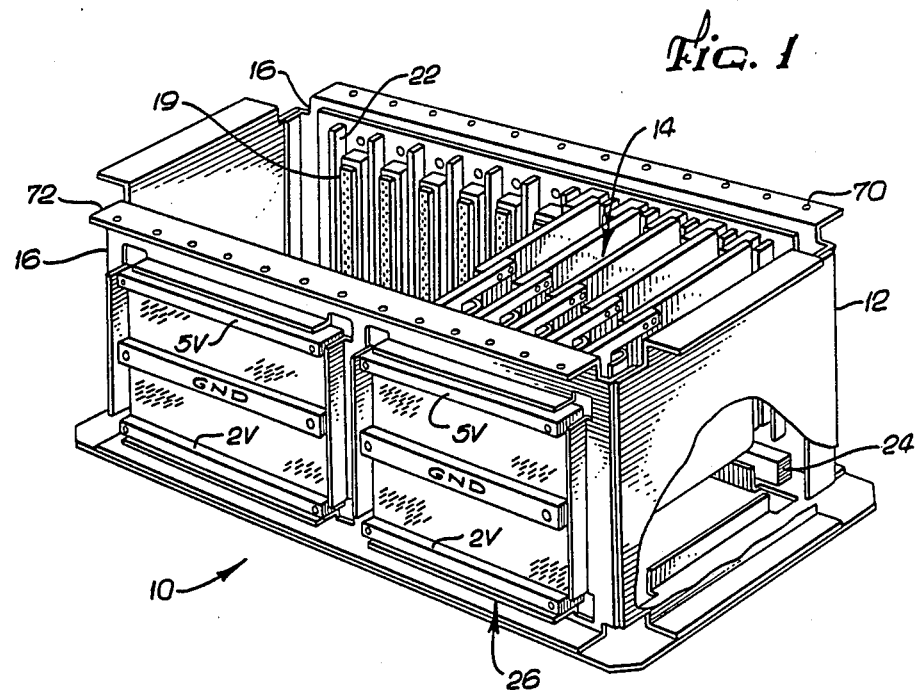
FIG. 1 is a perspective view of a central processing unit (CPU) card cage showing a number of printed circuit board modules mounted therein.

Referring to FIG. 1, the central processing unit (CPU) 10 of a computer includes a welded card cage assembly 12 having a number of printed circuit board modules or cards 14 mounted therein in a parallel fashion. In the CPU of the present invention, thirty cards are utilized; of course, a different number of cards could be employed, depending upon the requirements of the particular computer. The card cage 12 includes side panels 16. Located on the side panels are a plurality of pin connectors 19 which are interleaved with a number of combined stiffening rod/card guides 22. Although a variety of connectors may be utilized, the preferred embodiment of the invention employs low insertion force (LIF) type connectors, such as Bendix B$^3$ type connectors. Such connectors may include up to forty contacts per inch. The construction of such connectors is quite simple and their cost is therefore relatively low. The stiffeners 22 reduce any flexing of the side panels 16 and also serve to guide the modules 14 into place to make connections to the connectors 19. The vertical position of the modules 14 is fixed by a card stop 24. Connections from the modules 14 are made via the connectors to power buses 26 located on the outside of the side panels 16.

Figure 2:
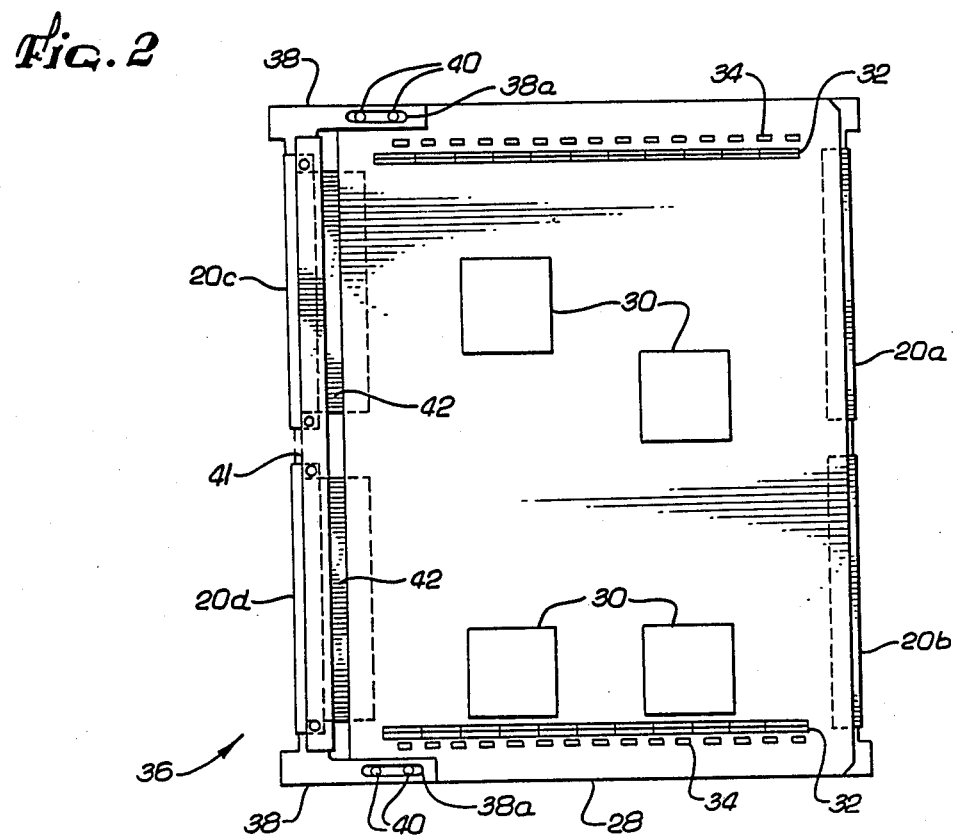
FIG. 2 is a top plan view of a printed circuit board module according to the present invention.

Referring to FIG. 2, a printed circuit board module 14 includes a printed circuit board 28 having a number of integrated circuit chips 30 secured to its surface. In addition, a number of resistance and capacitance components 32 and 34 are secured near opposite edges of the printed circuit board 28. Four input/output connectors 20 are used to make connections to the elements carried on the printed circuit board. These connections are made via printed circuit board wiring (not shown). In one embodiment of the invention, each connector includes two hundred and fifty-two pins. Connectors 20a and 20b are directly mounted on one edge of the printed circuit board 28. Connectors 20c and 20d are coupled to the opposite edge of the printed circuit board 28 by means of a moveable mounting assembly 36. The mounting assembly 36 includes a pair of slideable brackets 38 having a slot 38a. A pair of pins 40 secured at each end of the printed circuit board 28 pass through the slots 38a, and secure the brackets 38 to the printed circuit board. The brackets 38 are interconnected by means of a rigid stiffener assembly 41 which may be integral with the brackets or may be separately formed. Connectors 20c and 20d are carried within the stiffener 41. The stiffener serves to prevent any flexing of the connectors 20c and 20d, the bodies of which typically are formed of plastic. Interconnections between the connectors 20c and 20d and the edge of the printed circuit board 28 are made by means of a pair of flex cable connectors 42.

Figure 3:
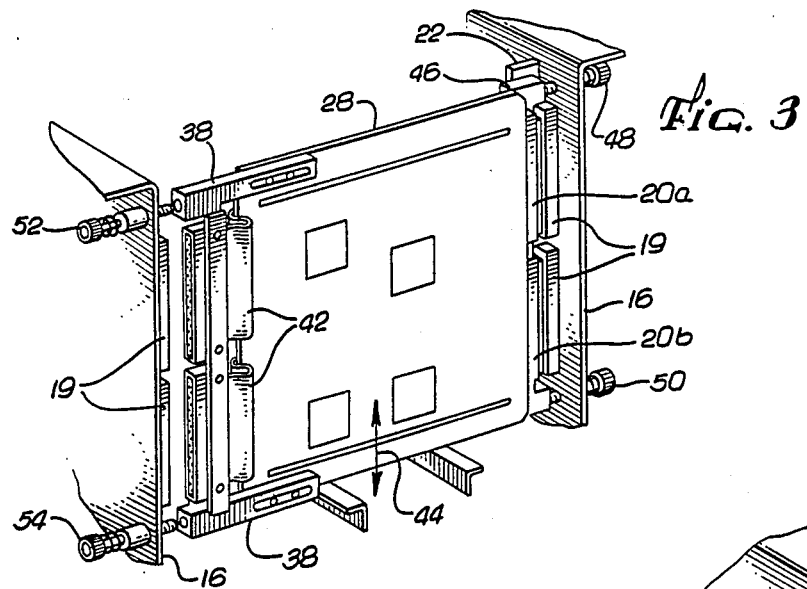
FIG. 3 is a perspective view showing the mounting arrangement for a single printed circuit board module.

Referring now to FIG. 3, an individual module 14 is shown positioned between side panels 16. The module 14 is inserted between the side panels 16 in the direction indicated by an arrow 44. The connectors 20a and 20b are surrounded by a stiffener 46 attached to the printed circuit board 28. The stiffener 46 is secured to the panel 16 by means of a pair of screws 48 and 50 which pass through the panel 16. Tightening of the screws causes the connectors 20a and 20b on the printed circuit board to mate with connectors 19 on the side panel.

The mounting assembly 36 is secured to the opposite side panel 16 by means of a pair of screws 52 and 54. The module 14 is slid into position with the mounting assembly 36 in a retracted position, in which the width of the module 14 is less than the space between connectors 19 on opposite side panels 16. Once the module 14 is in position, the screws 48, 50, 52 and 54 are tightened. Tightening of the screws 52 and 54 pulls the mounting assembly 36 to an extended position, causing the connectors 20c and 20d to mate with corresponding connectors on the side panel 16. The connection of the flex cables 42 facilitates motion of the mounting assembly 36 while maintaining the electrical connection to the printed circuit board 28.

Figure 4:
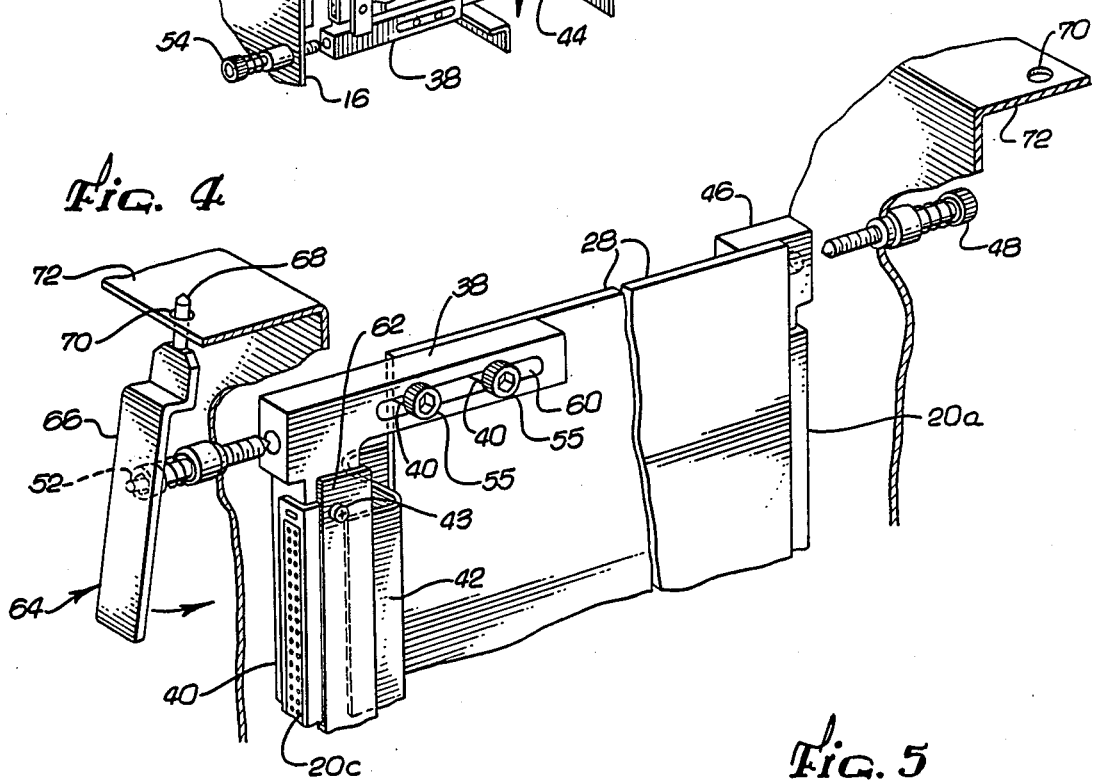
FIG. 4 is a perspective view showing details of the printed circuit board module.

FIG. 4 shows details of the mounting assembly 36. The brackets 38 are secured to the printed circuit board 28 by means of nuts 55 which fit over the pins 40. The mounting assembly 36 is biased toward the retracted position by means of a spring 60 which is located within the bracket 38 and presses against the inside of the bracket and one of the pins 40. The connector screws 48, 50, 52 and 54 are spring biased and may be pressed inward to make initial contact with mounting holes in the mounting assembly 36 and stiffener 46. When the screws are tightened, the mounting assembly 36 will be pulled outward, forcing the connectors 20c and 20d to mate with corresponding connectors 19 on the side panel. The connection between the flexible connector strips 42 and the corresponding connectors 20c and 20d, are made via a flex strip board 62, which is secured to the connectors 20c and 20d, and stiffener 41 by means of screws 43.

When it is desired to remove a module 14, the screws 48, 50, 52 and 54 are loosened. Since the connectors have some friction associated with them, the loosening of the screws may be insufficient to break the connections between connectors on the module and the side panels. In order to facilitate removal of a module, an extracting tool 64 is employed. The tool 64 is comprised of a metal bar 66 having a pin 68 which fits into an opening 70 in a flange 72 (FIG. 1) of the card cage. The extracting tool provides a lever action which, once the screws have been completely loosened, can be used to force the connectors apart.

Figure 5:
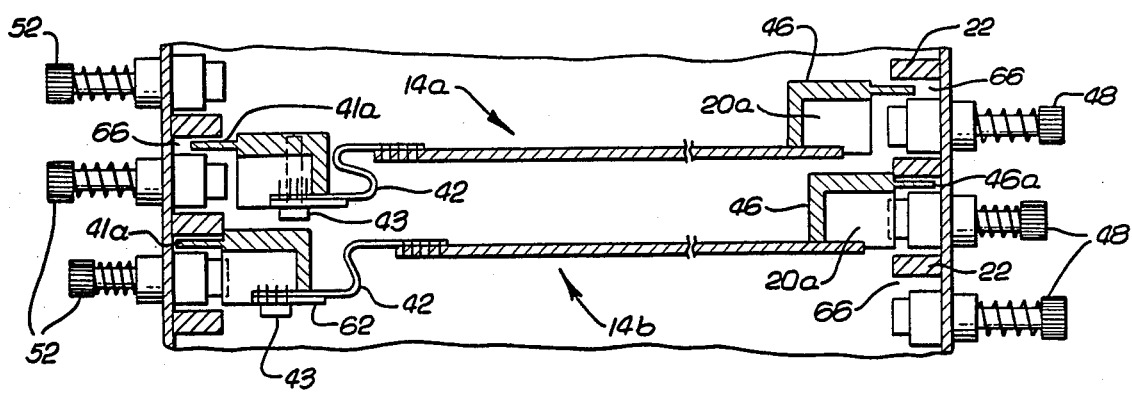
FIG. 5 is a top plan view of a portion of the card cage showing the mounting arrangement of printed circuit board modules.

Referring to FIG. 5, the stiffeners 41 and 46 may include extensions 41a, and 46a which serve as guide members to aid in mounting the modules 14 within the card cage. The extensions fit into slots 66 formed between the connectors 20 and card guides 22 on the side panels 16. After an extension has been placed in a slot, tightening of the screws 48, 50, 52 and 54 will pull the associated connector on the module into mating contact with a connector on the side panel.

In FIG. 5, a module 14a is shown in the retracted position, with the flex connector 42 being folded over upon itself. When the connection screws are tightened, the connectors at the opposite edges of the module will be forced into engagement with connectors on the side panels, and the flex strip 42 will extend so as to accommodate the motion of the mounting assembly 36. This situation is illustrated by module 14b in FIG. 5.

In summary, the present invention provides a simple and inexpensive connector design which enable connections to be made on both sides of a printed circuit board module. Broadly, the invention comprises a printed circuit board module which may be retracted to a width which enables the module to be inserted between connectors on opposing side panels and then extended to make connections to the connectors. In the preferred embodiment of the invention, this is facilitated by providing a slidable mounting assembly for the connectors coupled to one edge of a printed circuit, with the connectors for the opposite edge of the printed circuit board being directly connected to the board. Several other retractable module designs could be employed, including the use of two printed circuit boards each having one connector set on an edge, with a flexible connection being made between the circuit boards. The use of the sliding mounting assembly described, however, is preferrable because of its simplicity and reliability. The invention provides a low-cost, high density connector arrangement which facilitates small center-to-center spacing between printed circuit board modules.

I claim:

1. A printed circuit board module for connection to a pair of spaced parallel stationary panels having connectors thereon, comprising:

rigid printed circuit board means for supporting electronic circuits;

a first connector set means coupled to a first edge of the printed circuit board means, for making electrical connections between the printed circuit board means and the connectors on one panel; and a second connector set means, coupled to a second edge of the printed circuit board means which is opposite the first edge, for making electrical connections between the printed circuit board means and the connectors on the other panel, and first and second connector set means being movable with respect to one another in the direction of the plane of the circuit board means from a retracted position which enables the module to be inserted between the panels to an extended position in which the connector set means are coupled to the connectors of the panels, wherein the second connector set means remains coupled to the edge of the printed circuit board means in both the retracted and extended positions.

2. A printed circuit board module according to claim 1 wherein the printed circuit board means comprises a single printed circuit board, the first connector set means is mounted to the printed circuit board in a fixed position and the second connector set means is mounted so that it is movable toward and away from the printed circuit board.

3. A printed circuit board module according to claim 2 including a flexible connector set electrically connected between the printed circuit board and the second connector set means.

4. A printed circuit board module according to claim 3 including a mounting frame slidably attached to the printed circuit board, wherein the second conductor set means is secured to the mounting frame.

5. A printed circuit board module according to claim 4 in combination with a pair of spaced parallel panels having connectors thereon, and a plurality of fasteners for securing the first and second connector set means to the connectors on the panels, wherein one or more fasteners is initially connected between a panel and the mounting frame and is tightened to move the second connector set means to its extended positions.

6. The combination according to claim 5 including biasing means for biasing the mounting frame toward the retracted position.

7. The combination according to claim 5 including biasing means for biasing the mounting frame toward the retraction position.

8. The combination according to claim 1 or 5, including release means for forcing the mounting frame away from an adjacent panel to thereby disconnect the second connector set means from the associated panel connectors.

9. A card cage and printed circuit board assembly useful in computer systems, comprising:
a card cage comprising a main frame having first and second parallel side panels located a fixed distance apart from one another, each of the side panels having a plurality of electrical connector sets secured thereto in a parallel fashion; and
a plurality of printed circuit board modules carried within the card cage, wherein each of the modules comprises:
a rigid printed circuit board;
a first connector set means secured to one edge of the printed circuit board, said first connector set means being connected to a connector set of the first side panel,
a second connector set means movably secured to the edge of the printed circuit board opposite the first connector set means, said second connector set being movable in the direction of the plane of the circuit board from a retracted position which enables the module to be inserted into the card cage to an extended position in which the second connector set means is coupled to a corresponding connector set of the second side panel, wherein the second connector set means remains coupled to the edge of the printed circuit board means in both the retracted and extended positions; and
a flexible connector electrically connecting the second connector set means to the printed circuit board.

10. An assembly according to claim 9 including a plurality of fasteners secured between the printed circuit board modules and the side panels, wherein tightening of the fasteners will cause the first and second connector set means to couple with corresponding connector sets on the side panels.

11. An assembly according to claims 9 or 10 including guide means for guiding the first and second connector set means so that they properly mate with the side panel connector sets.

12. An assembly according to claim 11 wherein the guide means comprises a plurality of guide bars secured to each side panel and interleaved with the connector sets.

13. An assembly according to claim 12 wherein the guide bars and connector sets define slots therebetween, further including guide strips extending from the first and second connector set means, said guide strips being insertable into the slots to thereby position the modules.

14. An assembly according to claim 13 wherein the guide bars are rigid to thereby increase the rigidity of the side panels, said assembly further including rigid stiffener elements coupled to the first and second connector set means to increase the rigidity thereof, wherein the guide strips are part of the stiffener elements.

15. An assembly according to claim 9 including a slidable mounting assembly coupling the printed circuit board to the second connector set means.

* * * * *